(12) United States Patent
Hung et al.

(10) Patent No.: US 7,932,849 B2
(45) Date of Patent: Apr. 26, 2011

(54) METHOD FOR ACHIEVING HIGH-SPEED ANALOG-TO-DIGITAL CONVERSION WITHOUT DEGRADING ACCURACY, AND ASSOCIATED APPARATUS

(75) Inventors: Li-Han Hung, Taipei (TW); Tai-Cheng Lee, Kaohsiung (TW)

(73) Assignees: Mediatek Inc., Science-Based Industrial Park, Hsin-Chu (TW); National Taiwan University, Taipei (TW)

( * ) Notice: Subject to any disclaimer, the term of this patent is extended or adjusted under 35 U.S.C. 154(b) by 5 days.

(21) Appl. No.: 12/343,504

(22) Filed: Dec. 24, 2008

(65) Prior Publication Data
US 2010/0156682 A1 Jun. 24, 2010

(51) Int. Cl.
*H03M 1/38* (2006.01)
(52) U.S. Cl. ........................................ 341/161; 341/120
(58) Field of Classification Search .......... 341/118–122, 341/155, 161
See application file for complete search history.

(56) References Cited

U.S. PATENT DOCUMENTS

| | | | |
|---|---|---|---|
| 7,126,508 B2 * | 10/2006 | Seki | 341/118 |
| 7,161,514 B2 * | 1/2007 | Tamba | 341/120 |
| 7,280,064 B2 * | 10/2007 | Lin | 341/155 |
| 7,495,596 B2 * | 2/2009 | Kim et al. | 341/161 |
| 7,496,341 B2 * | 2/2009 | Chen et al. | 455/311 |
| 7,612,703 B2 * | 11/2009 | Chen et al. | 341/172 |
| 7,688,238 B2 * | 3/2010 | Lewis et al. | 341/120 |

* cited by examiner

*Primary Examiner* — Brian Young
(74) *Attorney, Agent, or Firm* — Winston Hsu; Scott Margo

(57) ABSTRACT

A method for achieving high-speed analog-to-digital conversion without degrading accuracy includes: receiving digital outputs of a plurality of pipelined analog-to-digital converters (ADCs) that perform analog-to-digital conversion on a same analog signal; and performing digital calculations on the digital outputs to generate a calibrated digital output. An apparatus for achieving high-speed analog-to-digital conversion without degrading accuracy is further provided. The apparatus includes: a digital module arranged to receive digital outputs of a plurality of pipelined ADCs that perform analog-to-digital conversion on a same analog signal. In addition, the digital module includes a plurality of digital calculation paths respectively corresponding to the pipelined ADCs, wherein each digital calculation path corresponding to an associate pipelined ADC of the pipelined ADCs is electrically connected to the associate pipelined ADC. The digital module performs digital calculations on the digital outputs to generate a calibrated digital output.

18 Claims, 11 Drawing Sheets

METHOD FOR ACHIEVING HIGH-SPEED ANALOG-TO-DIGITAL CONVERSION WITHOUT DEGRADING ACCURACY, AND ASSOCIATED APPARATUS

BACKGROUND

The present invention relates to analog-to-digital conversion, and more particularly, to a method for achieving high-speed analog-to-digital conversion without degrading accuracy, and to an associated apparatus.

According to the related art, a circuitry of high complexity is typically required for implementing an analog-to-digital converter (ADC) with high accuracy. In addition, the speed of analog-to-digital conversion of such an ADC with high accuracy is typically too slow to satisfy the requirements of many applications. In order to implement an ADC with low complexity and high speed, a conventional method typically utilizes a slow ADC of high accuracy as a tool to calibrate the ADC with low complexity. However, when using the conventional method, high tooling and labor costs are needed. A novel method for reducing the tooling and labor costs is required.

SUMMARY

It is therefore an objective of the claimed invention to provide a method for achieving high speed analog-to-digital conversion without degrading accuracy, and to provide an associated apparatus, in order to solve the above-mentioned problem.

An exemplary embodiment of a method for analog-to-digital conversion comprises: receiving digital outputs of a plurality of pipelined analog-to-digital converters (ADCs) that perform analog-to-digital conversion on a same analog signal; and performing digital calculations on the digital outputs to generate a calibrated digital output.

An exemplary embodiment of an apparatus for analog-to-digital conversion comprises: a digital module arranged to receive digital outputs of a plurality of pipelined ADCs that perform analog-to-digital conversion on a same analog signal. In addition, the digital module comprises a plurality of digital calculation paths respectively corresponding to the pipelined ADCs, wherein each digital calculation path corresponding to an associate pipelined ADC of the pipelined ADCs is electrically connected to the associate pipelined ADC. Additionally, the digital module performs digital calculations on the digital outputs to generate a calibrated digital output.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
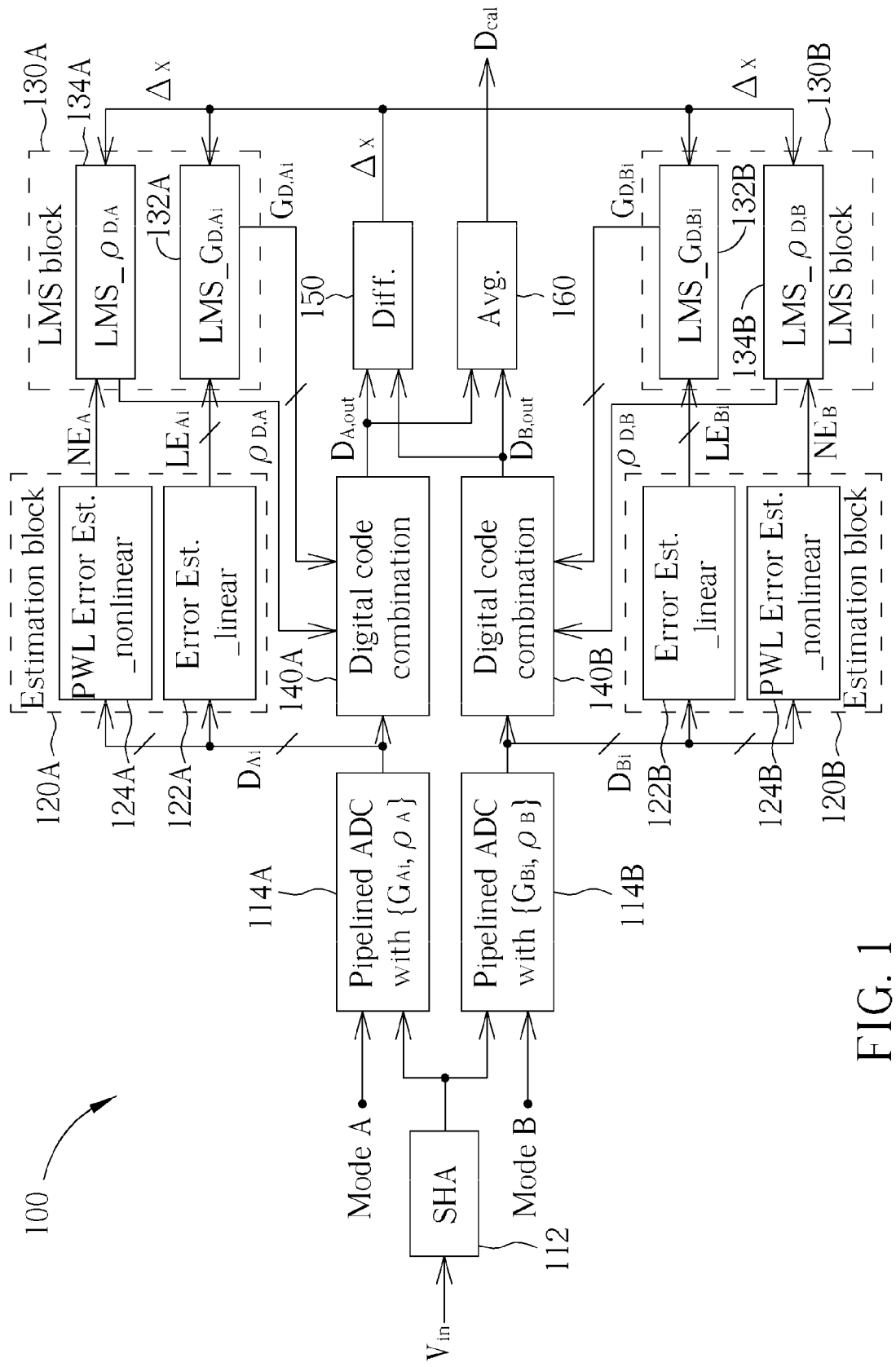
FIG. 1 is a diagram of an apparatus for achieving high speed analog-to-digital conversion without degrading accuracy according to a first embodiment of the present invention.

Please refer to FIG. 1, which illustrates a diagram of an apparatus 100 for achieving high-speed analog-to-digital conversion without degrading accuracy according to a first embodiment of the present invention. The apparatus 100 comprises an analog stage comprising: a sample and hold amplifier (SHA) 112, and a plurality of pipelined analog-to-digital converters (ADCs) such as two pipelined ADCs 114A and 114B ("Pipelined ADC with $\{G_{Ai}, \rho_A\}$" and "Pipelined ADC with $\{G_{Bi}, \rho_B\}$", respectively). In addition, the apparatus 100 further comprises a digital module comprising a plurality of digital calculation paths respectively corresponding to the plurality of pipelined ADCs, where each digital calculation path corresponding to an associate pipelined ADC of the pipelined ADCs is electrically connected to the associate pipelined ADC. Additionally, the apparatus 100 further comprises a difference calculation unit 150 ("Diff.") and an average unit 160 ("Avg."), which is the next stage of the plurality of digital calculation paths.

In this embodiment, the number of pipelined ADCs shown in FIG. 1 is two, and the digital module comprises a first digital calculation path corresponding to the pipelined ADC 114A, and further comprises a second digital calculation path corresponding to the pipelined ADC 114B. This is for illustrative purposes only, and is not meant to be a limitation of the present invention. According to a variation of this embodiment, the number of pipelined ADCs is more than two, and the digital module comprises respective digital calculation paths corresponding to the pipelined ADCs.

According to this embodiment, each digital calculation path corresponding to the associate pipelined ADC of the pipelined ADCs comprises an estimation unit, an adaptive processing unit (such as the Least Mean Square (LMS) adaptive processing unit shown in FIG. 1), and a digital code combination unit. For example, the first digital calculation path mentioned above comprises an estimation unit such as an estimation block 120A, an LMS adaptive processing unit such as an LMS block 130A, and a digital code combination unit 140A (labeled "Digital code combination"). In addition, the second digital calculation path mentioned above comprises an estimation unit such as an estimation block 120B, an LMS adaptive processing unit such as an LMS block 130B, and a digital code combination unit 140B (labeled "Digital code combination").

More particularly, in this embodiment, the estimation block 120A comprises a linear estimation sub-unit 122A ("Error Est. _linear") and a nonlinear estimation sub-unit 124A ("PWL Error Est. _nonlinear"), while the LMS block 130A comprises a linear LMS adaptive processing sub-unit 132A ("LMS_$G_{D,\,Ai}$") and a nonlinear LMS adaptive processing sub-unit 134A ("LMS_$\rho_{D,\,A}$") respectively corresponding to the linear estimation sub-unit 122A and the nonlinear estimation sub-unit 124A. Similarly, the estimation block 120B comprises a linear estimation sub-unit 122B ("Error Est. _linear") and a nonlinear estimation sub-unit 124B ("PWL Error Est. _nonlinear"), while the LMS block 130B comprises a linear LMS adaptive processing sub-unit 132B ("LMS_$G_{D,\,Bi}$") and a nonlinear LMS adaptive processing sub-unit 134B ("LMS_$\rho_{D,\,B}$") respectively corresponding to the linear estimation sub-unit 122B and the nonlinear estimation sub-unit 124B.

As shown in FIG. 1, the digital module is divided into respective units or blocks, some of which are further divided into respective sub-units. This is for illustrative purposes only, and is not meant to be a limitation of the present invention. According to a variation of this embodiment, at least a portion of the digital module can be integrated into the same unit/block or the same sub-unit. For example, a portion of units/blocks of the digital module can be integrated into the same unit/block. In another example, a portion of sub-units can be integrated into the same sub-unit.

In addition, at least a portion of the digital module can be implemented with hardware circuits and/or a controller executing a program code. For example, at least a portion of the digital module can be implemented with a controller executing a read only memory (ROM) code. This is for illustrative purposes only, and is not meant to be a limitation of the present invention. According to a variation of this embodiment, at least a portion of the digital module can be implemented with a micro processing unit (MPU) executing a software code. According to another variation of this embodiment, at least a portion of the digital module can be implemented with a micro control unit (MCU) executing a firmware code.

Figure 2:
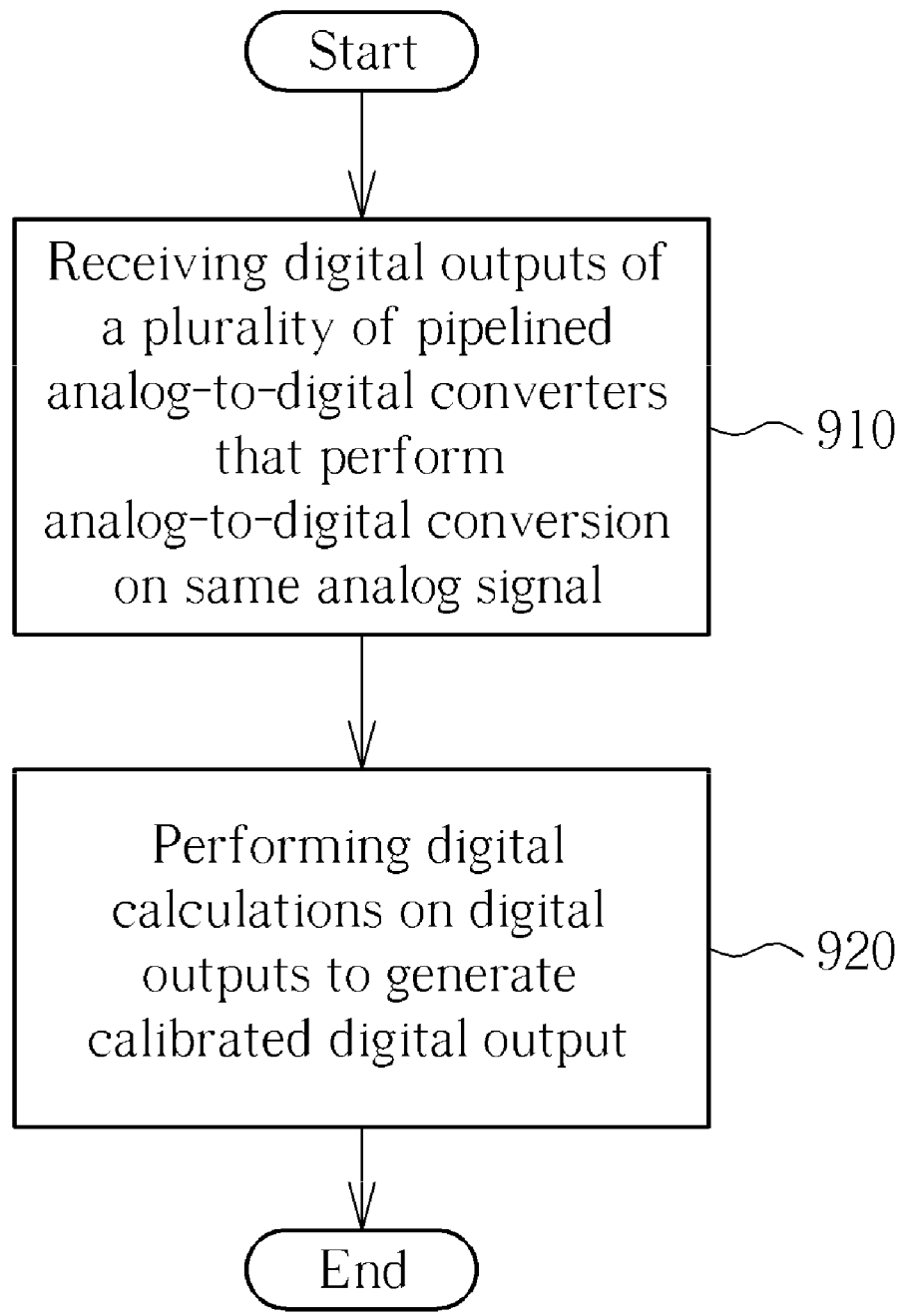
FIG. 2 is a flowchart of a method for achieving high speed analog-to-digital conversion without degrading accuracy according to one embodiment of the present invention.

FIG. 2 is a flowchart of a method for achieving high-speed analog-to-digital conversion without degrading accuracy according to one embodiment of the present invention. The method shown in FIG. 2 can be applied to the apparatus 100, and more particularly, to the digital module mentioned above. In addition, the method shown in FIG. 2 can be implemented by utilizing the apparatus 100, and more particularly, by utilizing the digital module mentioned above. The method is described as follows.

In Step 910, the digital module receives digital outputs of the plurality of pipelined ADCs that perform analog-to-digital conversion on a same analog signal. In particular, the digital module is implemented with a controller executing a ROM code, and the controller executing the ROM code receives the digital outputs of the plurality of pipelined ADCs 114A and 114B that perform analog-to-digital conversion on the same analog signal.

In Step 920, the digital module performs digital calculations on the digital outputs to generate a calibrated digital output $D_{cal}$. In particular, the digital module is implemented with the controller executing the ROM code as mentioned in Step 910, and the controller executing the ROM code performs the digital calculations on the digital outputs to generate the calibrated digital output $D_{cal}$.

According to this embodiment, the SHA 112 performs a sample and hold operation on an analog input signal $V_{in}$ of the apparatus 100 to generate a derivative of the analog input signal $V_{in}$ for the pipelined ADCs 114A and 114B, where the pipelined ADCs 114A and 114B perform analog-to-digital conversion on a same analog signal such as the derivative of the analog input signal $V_{in}$. As shown in FIG. 1, respective inputs of the pipelined ADCs 114A and 114B are electrically connected to the analog signal, and the apparatus 100 utilizes the pipelined ADCs 114A and 114B to perform analog-to-digital conversion on the analog signal. This is for illustrative purposes only, and is not meant to be a limitation of the present invention. According to a variation of this embodiment, the analog input signal $V_{in}$ is ready for use, while the pipelined ADCs 114A and 114B directly perform analog-to-digital conversion on a same analog signal such as the analog input signal $V_{in}$.

Please note that the pipelined ADCs 114A and 114B are operated in different residue modes, e.g. Mode A and Mode B, respectively. For example, Mode A and Mode B are predetermined modes defined within the apparatus 100. In another example, Mode A and Mode B are selected by selection signals received from outside the apparatus 100.

Figure 3:
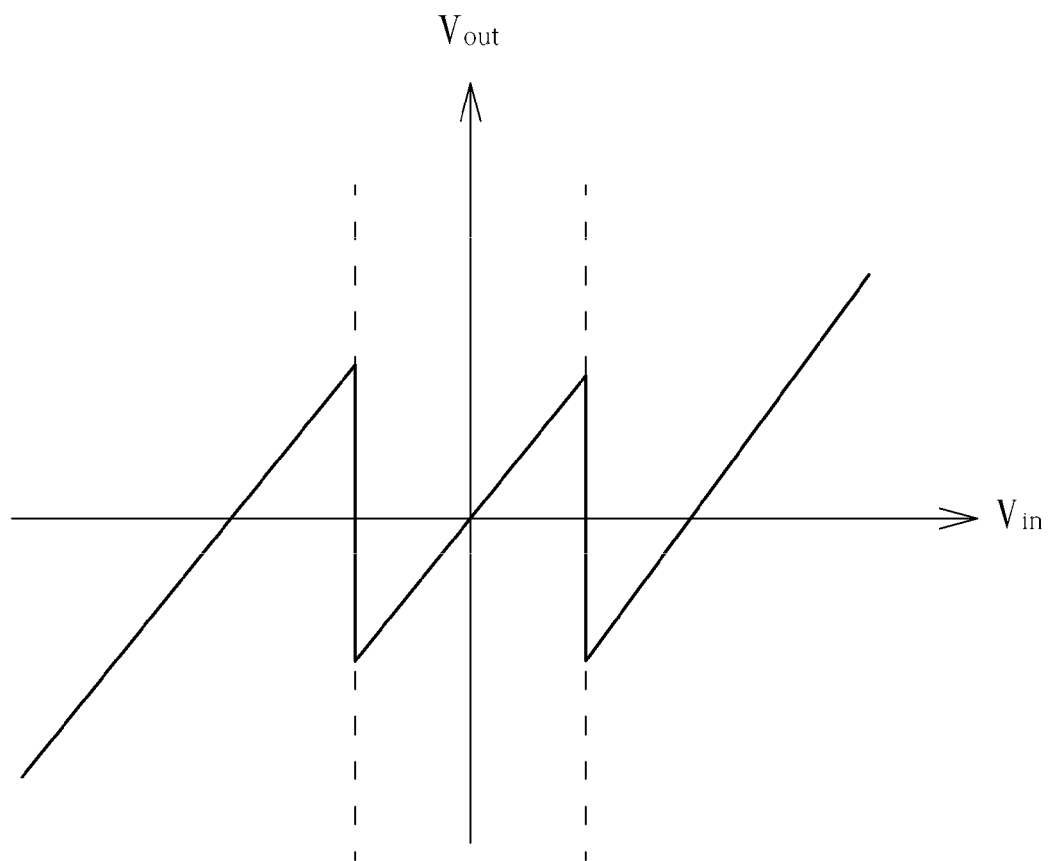
FIG. 3 illustrates an example of a first residue mode utilized by the method shown in FIG. 2.

FIG. 3 illustrates an example of a first residue mode (e.g. Mode 1) utilized by the method shown in FIG. 2. Here, $V_{in}$ represents an input voltage of a stage of a pipelined ADC such as the pipelined ADC 114A or the pipelined ADC 114B, while $V_{out}$ represents an output voltage of the stage. In the first residue mode, the curve shown in FIG. 3 zigzags from left to right with a first curve-shift and a second curve-shift respectively located at a negative value and a positive value of the input voltage $V_{in}$.

Figure 4:
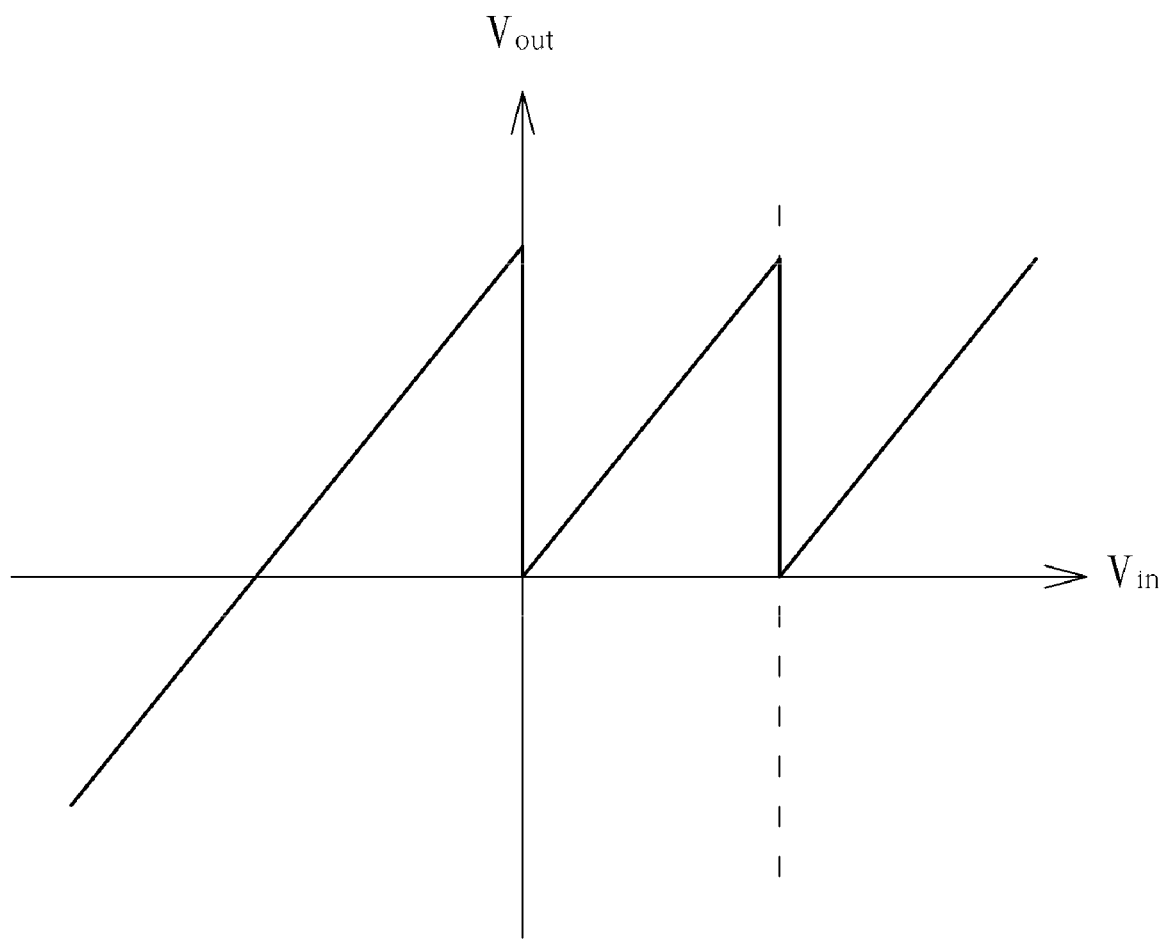
FIG. 4 illustrates an example of a second residue mode utilized by the method shown in FIG. 2.

FIG. 4 illustrates an example of a second residue mode (e.g. Mode 2) utilized by the method shown in FIG. 2. In the second residue mode, the curve shown in FIG. 4 zigzags from left to right with a first curve-shift and a second curve-shift respectively located at a zero value and a positive value of the input voltage $V_{in}$. In particular, the interval between the first curve-shift and the second curve-shift with respect to the horizontal axis in the second residue mode is as wide as that in the first residue mode.

Figure 5:
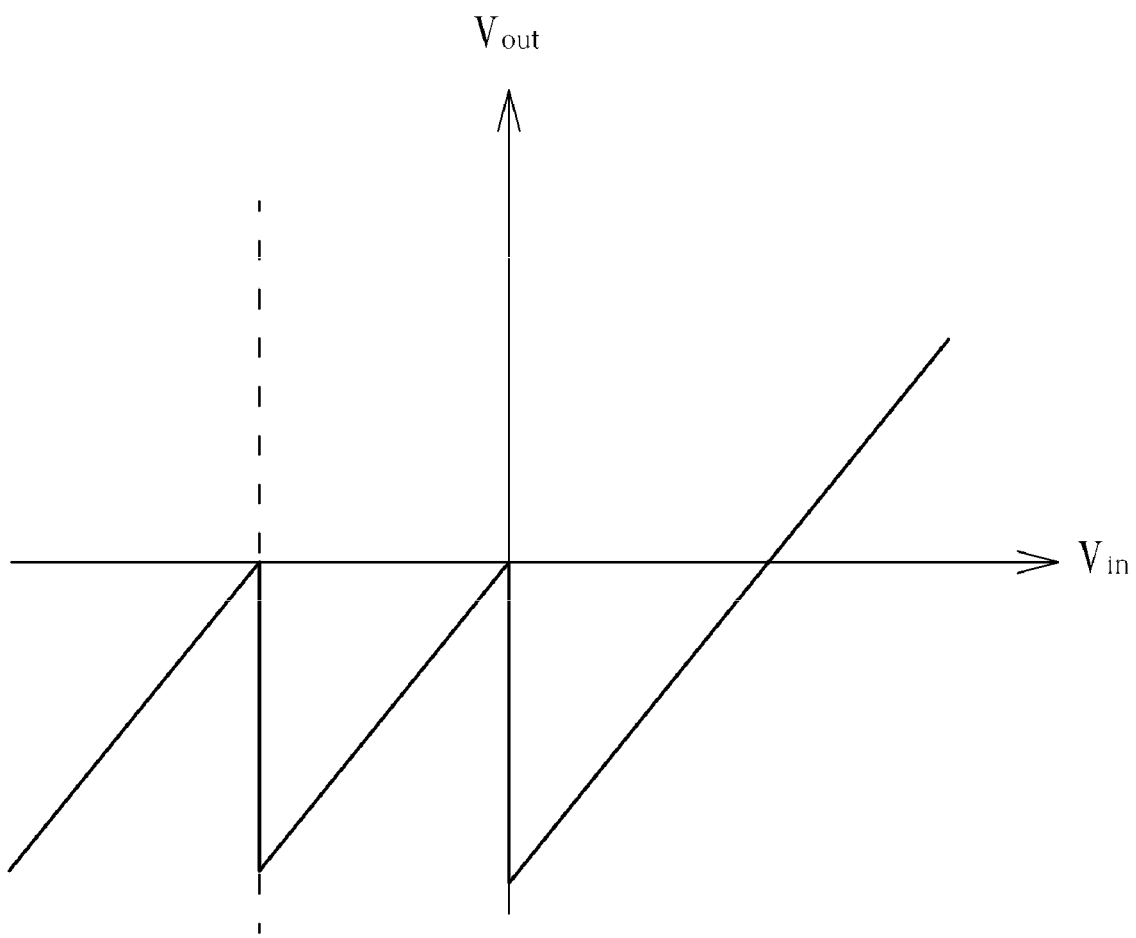
FIG. 5 illustrates an example of a third residue mode utilized by the method shown in FIG. 2.

FIG. 5 illustrates an example of a third residue mode (e.g. Mode 3) utilized by the method shown in FIG. 2. In the third residue mode, the curve shown in FIG. 5 zigzags from left to right with a first curve-shift and a second curve-shift respectively located at a negative value and a zero value of the input voltage $V_{in}$. In particular, the interval between the first curve-shift and the second curve-shift with respect to the horizontal axis in the third residue mode is as wide as that in the first residue mode.

Figure 6:
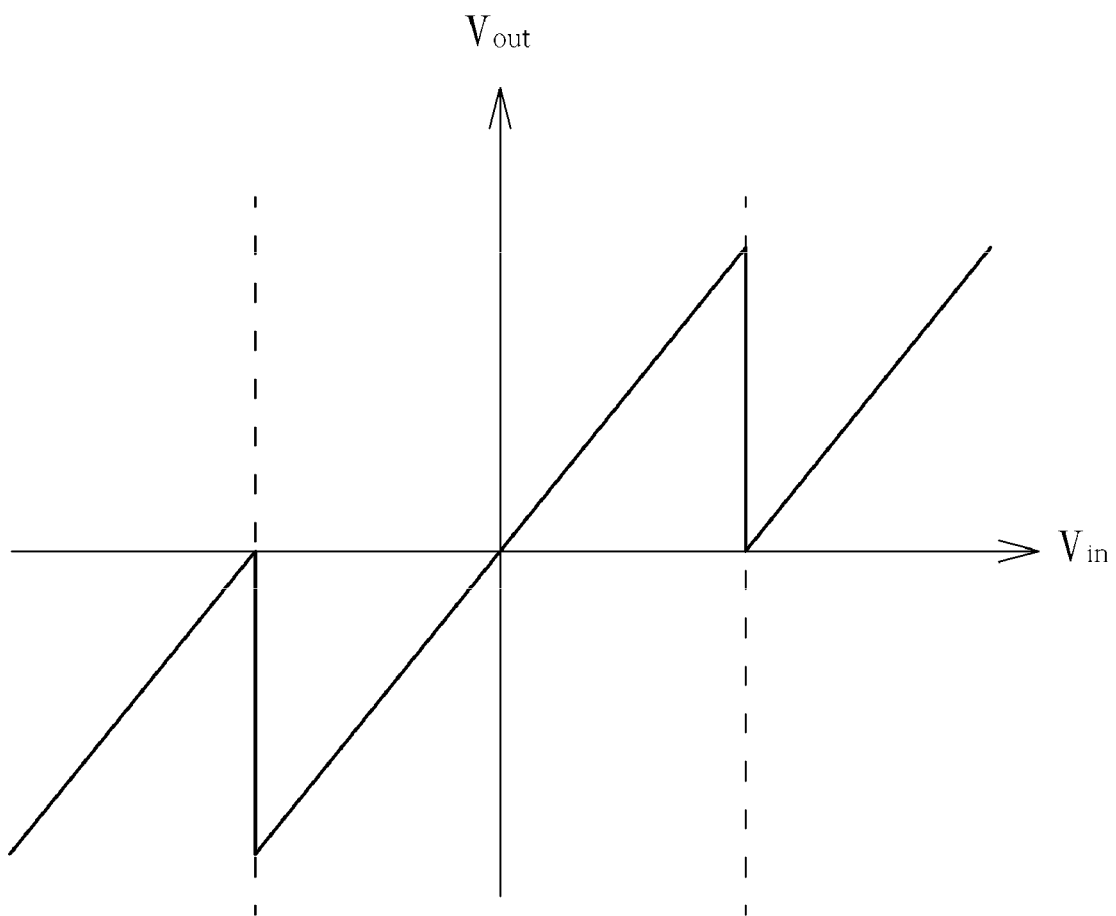
FIG. 6 illustrates an example of a fourth residue mode utilized by the method shown in FIG. 2.

FIG. 6 illustrates an example of a fourth residue mode (e.g. Mode 4) utilized by the method shown in FIG. 2. In the fourth residue mode, the curve shown in FIG. 6 zigzags from left to right with a first curve-shift and a second curve-shift respectively located at a negative value and a positive value of the input voltage $V_{in}$. In particular, the interval between the first curve-shift and the second curve-shift with respect to the horizontal axis in the fourth residue mode is twice as wide as that in the first residue mode.

As shown in FIG. 1, the pipelined ADC 114A is labeled "Pipelined ADC with $\{G_{Ai}, \rho_A\}$", where $G_{Ai}$ represents a gain value of the $i^{th}$ stage of the pipelined ADC 114A, and $\rho_A$ represents a nonlinear parameter of the pipelined ADC 114A. The pipelined ADC 114A of this embodiment generates a digital output corresponding to $\{G_{Ai}, \rho_A | i=1, 2, \ldots, \text{etc.}\}$. For example, the digital output of the pipelined ADC 114A comprises digital codes $\{D_{Ai} | i=1, 2, \ldots, \text{etc.}\}$ respectively corresponding to the stages $1, 2, \ldots$, etc. of the pipelined ADC 114A, where $D_{Ai}$ represents the digital code corresponding to the $i^{th}$ stage of the pipelined ADC 114A. Similarly, the pipelined ADC 114B is labeled "Pipelined ADC with $\{G_{Bi}, \rho_B\}$", where $G_{Bi}$ represents a gain value of the $i^{th}$ stage of the pipelined ADC 114B, and $\rho_B$ represents a nonlinear parameter of the pipelined ADC 114B. The pipelined ADC 114B of this embodiment generates a digital output corresponding to $\{G_{Bi}, \rho_B | i=1, 2, \ldots, \text{etc.}\}$. For example, the digital output of the pipelined ADC 114B comprises digital codes $\{D_{Bi} | i=1, 2, \ldots, \text{etc.}\}$ respectively corresponding to the stages $1, 2, \ldots$, etc. of the pipelined ADC 114B, where $D_{Bi}$ represents the digital code corresponding to the $i^{th}$ stage of the pipelined ADC 114B.

In this embodiment, the digital module is arranged to receive the digital outputs of the plurality of pipelined ADCs (e.g. the pipelined ADC 114A and 114B), and is arranged to perform the digital calculations on the digital outputs to generate the calibrated digital output $D_{cal}$. More particularly, the first and second digital calculation paths mentioned above are arranged to respectively receive the digital outputs of the pipelined ADC 114A and 114B and perform a considerable portion of the digital calculations accordingly, and the difference calculation unit 150 (labeled "Diff.") is arranged to calculate a difference $\Delta X$ between latest values of respective outputs $D_{A,out}$ and $D_{B,out}$ of the first and second digital calculation paths, where the difference $\Delta X$ serves as error information for the first and second digital calculation paths. In addition, the average unit 160 (labeled "Avg.") is arranged to average the latest values of the respective outputs $D_{A,out}$ and $D_{B,out}$ of the first and second digital calculation paths, in order to generate the calibrated digital output $D_{cal}$.

Regarding the aforementioned considerable portion of the digital calculations, some implementation details of the first and second digital calculation paths are further described as follows.

According to this embodiment, the estimation unit such as the estimation block 120A is arranged to estimate coefficients $\{LE_{Ai} | i=1, 2, \ldots, \text{etc.}\}$ and $NE_A$ corresponding to errors of the associate pipelined ADC 114A according to the digital codes $\{D_{Ai} | i=1, 2, \ldots, \text{etc.}\}$ respectively corresponding to the stages $1, 2, \ldots$, etc. of the pipelined ADC 114A. Here, $LE_{Ai}$ (in which LE stands for Linear Error) represents the coefficient corresponding to the linear error of the $i^{th}$ stage of the pipelined ADC 114A, and $NE_A$ (in which NE stands for Nonlinear Error) represents the coefficient corresponding to the nonlinear error of the pipelined ADC 114A. More particularly, the linear estimation sub-unit 122A (labeled "Error Est. _ linear") estimates the coefficients $\{LE_{Ai} | i=1, 2, \ldots, \text{etc.}\}$ according to the digital codes $\{D_{Ai} | i=1, 2, \ldots, \text{etc.}\}$, and the nonlinear estimation sub-unit 124A (labeled "PWL Error Est. _ nonlinear") estimates the coefficient $NE_A$ according to the digital codes $\{D_{Ai} | i=1, 2, \ldots, \text{etc.}\}$. The LMS adaptive processing unit such as the LMS block 130A utilizes the estimated coefficients $\{LE_{Ai} | i=1, 2, \ldots, \text{etc.}\}$ and $NE_A$ to perform LMS adaptive processing.

In practice, the LMS adaptive processing unit such as the LMS block 130A performs the LMS adaptive processing according to the difference $\Delta X$, in order to generate the latest digital estimation values $\{G_{D,Ai} | i=1, 2, \ldots, \text{etc.}\}$ of gain values $\{G_{Ai} | i=1, 2, \ldots, \text{etc.}\}$ of the stages $1, 2, \ldots$, etc. of the pipelined ADC 114A respectively, and to further generate the latest digital estimation value $\rho_{D,A}$ of the nonlinear parameter $\rho_A$ of the pipelined ADC 114A. More particularly, the linear LMS adaptive processing sub-unit 132A ("LMS_$G_{D,Ai}$") generates the latest digital estimation values $\{G_{D,Ai} | i=1, 2, \ldots, \text{etc.}\}$ according to the estimated coefficients $\{LE_{Ai} | i=1, 2, \ldots, \text{etc.}\}$ and the difference $\Delta X$, respectively. In addition, the nonlinear LMS adaptive processing sub-unit 134A (labeled "LMS_$\rho_{D,A}$") generates the latest digital estimation value $\rho_{D,A}$ according to the estimated coefficient $NE_A$ and the difference $\Delta X$.

The digital code combination unit 140A (labeled "Digital code combination") performs a digital code combination on the latest digital estimation values $\{G_{D,Ai} | i=1, 2, \ldots, \text{etc.}\}$ of the gain values $\{G_{Ai} | i=1, 2, \ldots, \text{etc.}\}$, the latest digital estimation value $\rho_{D,A}$ of the nonlinear parameter $\rho_A$, and the respective digital codes $\{D_{Ai} | i=1, 2, \ldots, \text{etc.}\}$ of the associated digital output corresponding to the associate pipelined ADC 114A, in order to perform calibration on the aforementioned first digital calculation path.

Similarly, the estimation unit such as the estimation block 120B is arranged to estimate coefficients $\{LE_{Bi} | i=1, 2, \ldots, \text{etc.}\}$ and $NE_B$ corresponding to errors of the associate pipelined ADC 114B according to the digital codes $\{D_{Bi} | i=1, 2, \ldots, \text{etc.}\}$ respectively corresponding to the stages $1, 2, \ldots$, etc. of the pipelined ADC 114B. Here, $LE_{Bi}$ (in which LE stands for Linear Error) represents the coefficient corresponding to the linear error of the $i^{th}$ stage of the pipelined ADC 114B, and $NE_B$ (in which NE stands for Nonlinear Error) represents the coefficient corresponding to the nonlinear error of the pipelined ADC 114B. More particularly, the linear estimation sub-unit 122B ("Error Est. _linear") estimates the coefficients $\{LE_{Bi} | i=1, 2, \ldots, \text{etc.}\}$ according to the digital codes $\{D_{Bi} | i=1, 2, \ldots, \text{etc.}\}$, and the nonlinear estimation sub-unit 124B ("PWL Error Est. _nonlinear") estimates the coefficient $NE_B$ according to the digital codes $\{D_{Bi} | i=1, 2, \ldots, \text{etc.}\}$. The LMS adaptive processing unit such as the LMS block 130B utilizes the estimated coefficients $\{LE_{Bi} | i=1, 2, \ldots, \text{etc.}\}$ and $NE_B$ to perform LMS adaptive processing.

In practice, the LMS adaptive processing unit such as the LMS block 130B performs the LMS adaptive processing according to the difference $\Delta X$, in order to generate the latest digital estimation values $\{G_{D,Bi} | i=1, 2, \ldots, \text{etc.}\}$ of gain values $\{G_{Bi} | i=1, 2, \ldots, \text{etc.}\}$ of the stages $1, 2, \ldots$, etc. of the pipelined ADC 114B respectively, and to further generate the latest digital estimation value $\rho_{D,B}$ of the nonlinear parameter $\rho_B$ of the pipelined ADC 114B. More particularly, the linear LMS adaptive processing sub-unit 132B ("LMS_$_{GD\ Bi}$") generates the latest digital estimation values $\{G_{D,Bi} | i=1, 2, \ldots, \text{etc.}\}$ according to the estimated coefficients $\{LE_{Bi} | i=1, 2, \ldots, \text{etc.}\}$ and the difference $\Delta X$, respectively. In addition, the nonlinear LMS adaptive processing sub-unit 134B ("LMS_$\rho_{D,B}$") generates the latest digital estimation value $\rho_{D,B}$ according to the estimated coefficient $NE_B$ and the difference $\Delta X$.

The digital code combination unit 140B (labeled "Digital code combination") performs a digital code combination on the latest digital estimation values $\{G_{D,Bi} | i=1, 2, \ldots, \text{etc.}\}$ of the gain values $\{G_{Bi} | i=1, 2, \ldots, \text{etc.}\}$, the latest digital estimation value $\rho_{D,B}$ of the nonlinear parameter $\rho_B$, and the respective digital codes $\{D_{Bi} | i=1, 2, \ldots, \text{etc.}\}$ of the associated digital output corresponding to the associate pipelined ADC 114B, in order to perform calibration on the aforementioned second digital calculation path.

In this embodiment, the nonlinear estimation and the nonlinear LMS adaptive processing are involved. This is for illustrative purposes only, and is not meant to be a limitation of the present invention. According to a variation of this embodiment, the nonlinear estimation sub-unit 124A ("PWL Error Est. _nonlinear") and the nonlinear LMS adaptive processing sub-unit 134A ("LMS_$\rho_{D,A}$") are omitted, where the digital code combination unit 140A of this variation performs the digital code combination on the latest digital estimation values $\{G_{D,Ai}|i=1, 2, \ldots, \text{etc.}\}$ of the gain values $\{G_{Ai}|i=1, 2, \ldots, \text{etc.}\}$ and the respective digital codes $\{D_{Ai}|i=1, 2, \ldots, \text{etc.}\}$ of the associated digital output corresponding to the associate pipelined ADC 114A, in order to perform calibration on the aforementioned first digital calculation path. Similarly, in this variation, the nonlinear estimation sub-unit 124B ("PWL Error Est. _nonlinear") and the nonlinear LMS adaptive processing sub-unit 134B ("LMS_$\rho_{D,B}$") are omitted, where the digital code combination unit 140B of this variation performs the digital code combination on the latest digital estimation values $\{G_{D,Bi}|i=1, 2, \ldots, \text{etc.}\}$ of the gain values $\{G_{Bi}|i=1, 2, \ldots, \text{etc.}\}$ and the respective digital codes $\{D_{Bi}|i=1, 2, \ldots, \text{etc.}\}$ of the associated digital output corresponding to the associate pipelined ADC 114B, in order to perform calibration on the aforementioned second digital calculation path.

For better comprehension, some details of the method shown in FIG. 2 are further explained as follows.

Figure 7:
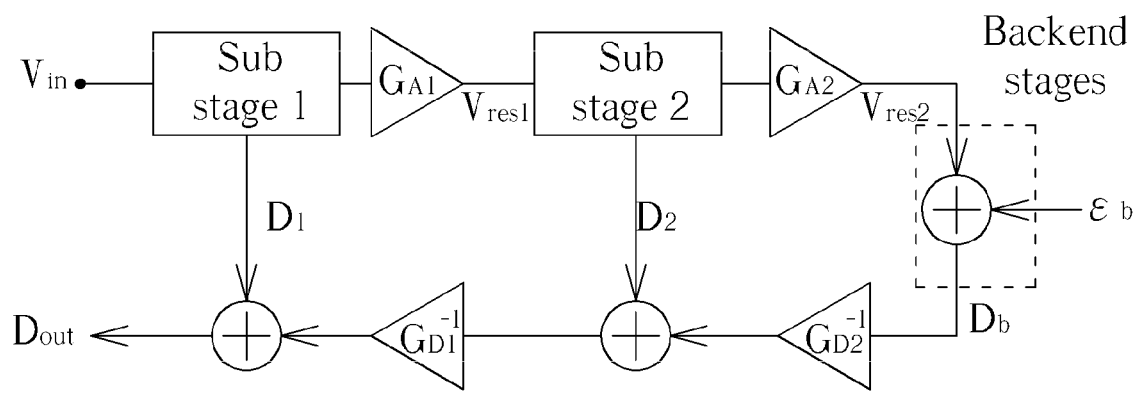
FIG. 7 illustrates an example of a linear error analysis model utilized by the method shown in FIG. 2 according to an embodiment of the present invention.

FIG. 7 illustrates an example of a linear error analysis model utilized by the method shown in FIG. 2 according to an embodiment of the present invention. The linear error analysis model can be applied to the pipelined ADC 114A or the pipelined ADC 114B.

For example, the linear error analysis model is applied to the pipelined ADC 114A. The notations $G_{A1}$ and $G_{A2}$ shown in FIG. 7 represent analog parameters such as $\{G_{Ai}|i=1\}$ and $\{G_{Ai}|i=2\}$, respectively. The notations $G_{D1}$ and $G_{D2}$ shown in FIG. 7 represent associated digital parameters such as $\{G_{D,Ai}|i=1\}$ and $\{G_{D,Ai}|i=2\}$, respectively. In addition, the notations $D_1$ and $D_2$ shown in FIG. 7 represent digital codes generated from sub-stages 1 and 2, respectively. Given that the sub-stages 1 and 2 respectively represent the stages 1 and 2 of the pipelined ADC 114A, the notation $D_{out}$ shown in FIG. 7 represents the output $D_{A,out}$ of the first digital calculation path.

In another example, the linear error analysis model is applied to the pipelined ADC 114B. The notations $G_{A1}$ and $G_{A2}$ shown in FIG. 7 represent analog parameters such as $\{G_{Bi}|i=1\}$ and $\{G_{Bi}|i=2\}$, respectively. The notations $G_{D1}$ and $G_{D2}$ shown in FIG. 7 represent associated digital parameters such as $\{G_{D,Bi}|i=1\}$ and $\{G_{D,Bi}|i=2\}$, respectively. In addition, the notations $D_1$ and $D_2$ shown in FIG. 7 represent digital codes generated from sub-stages 1 and 2, respectively. Given that the sub-stages 1 and 2 respectively represent the stages 1 and 2 of the pipelined ADC 114B, the notation $D_{out}$ shown in FIG. 7 represents the output $D_{B,out}$ of the second digital calculation path.

According to this embodiment, the notations $V_{res1}$ and $V_{res2}$ represent respective residue values corresponding to the sub-stages 1 and 2. In addition, the backend stages starting from the sub-stage next to the sub-stage 2 are modeled with a block labeled "Backend stages", which sums up an error term $\epsilon_b$ and the residue value $V_{res2}$ to generate a backend digital value $D_b$. This is for illustrative purposes only, and is not meant to be a limitation of the present invention. According to a variation of this embodiment, the linear error analysis model may incorporate more than two stages, for example, the sub-stages 1, 2, ..., W, where the backend stages starting from the sub-stage next to the sub-stage W are modeled with the block labeled "Backend stages", which sums up the error term $\epsilon_b$ and the residue value $V_{res\_W}$ to generate the backend digital value $D_b$.

In this embodiment, the output $D_{out}$ can be described with the following equation:

$$D_{out}=D_1+D_2/G_{D1}+D_b/(G_{D1}*G_{D2}) \qquad (1);$$

where $D_b/(G_{D1}*G_{D2})$ can be expressed as follows:

$$D_b/(G_{D1}*G_{D2})=(1/(G_{D1}*G_{D2}))*(((V_{in}-D_1)*G_{A1}-D_2)*G_{A2}+\epsilon_b).$$

If $G_{D1}=G_{A1}$ and $G_{D2}=G_{A2}$, then an equation representing ideal AD conversion can be obtained as follows:

$$D_{out}=V_{in}+\epsilon_b/(G_{D1}*G_{D2}).$$

Suppose that $G_{D1}$ does not match $G_{A1}$ and $G_{D2}$ does not match $G_{A2}$, for example:

$$G_{D1}=G_{A1}*(1+\epsilon_1); \text{ and}$$

$$G_{D2}=G_{A2}*(1+\epsilon_2).$$

Then, Equation (1) can be rewritten as follows:

$$D_{out}=D_1+D_2/(G_{A1}*(1+\epsilon_1))+D_b/(G_{A1}*G_{A2}*(1+\epsilon_1)*(1+\epsilon_2)).$$

For approximation purpose, certain terms of the above equation can be re-written by using a Taylor expansion as follows:

$$1/(G_{A1}*(1+\epsilon_1))=(1/G_{A1})*(1-\epsilon_1+\epsilon_1^2); \text{ and}$$

$$1/(G_{A2}*(1+\epsilon_2))=(1/G_{A2})*(1-\epsilon_2+\epsilon_2^2).$$

And therefore, $$1/(G_{A1}*G_{A2}*(1+\epsilon_1)*(1+\epsilon_2))=(1/(G_{A1}*G_{A2}))*(1-\epsilon_1-\epsilon_2+\epsilon_1^2+\epsilon_1*\epsilon_2+\epsilon_2^2).$$

As a result, Equation (1) can be re-arranged as follows:

$$\begin{aligned}D_{out} &= D_1 + D_2/(G_{A1}*(1+\epsilon_1)) + D_b/\\ &\quad (G_{A1}*G_{A2}*(1+\epsilon_1)*(1+\epsilon_2))\\ &= D_1 + (D_2/G_{A1})*(1-\epsilon_1+\epsilon_1^2) +\\ &\quad (D_b/(G_{A1}*G_{A2}))*(1-\epsilon_1-\epsilon_2+\epsilon_1^2+\epsilon_1*\epsilon_2+\epsilon_2^2)\\ &= (D_1 + D_2/G_{A1} + D_b/(G_{A1}*G_{A2})) -\\ &\quad (\epsilon_1-\epsilon_1^2)*(D_2/G_{A1}+D_b/(G_{A1}*G_{A2})) -\\ &\quad (\epsilon_2-(\epsilon_1*\epsilon_2+\epsilon_2^2))*(D_b/(G_{A1}*G_{A2})).\end{aligned}$$

By introducing the following definitions:

$$D_{correct}=D_1+D_2/G_{A1}+D_b/(G_{A1}*G_{A2});$$

$$LE_1=D_2/G_{A1}+D_b/(G_{A1}*G_{A2}); \text{ and}$$

$$LE_2=D_b/(G_{A1}*G_{A2});$$

Equation (1) can be rewritten as follows:

$$D_{out}=D_{correct}-(\epsilon_1-\epsilon_1^2)*LE_1-(\epsilon_2-(\epsilon_1*\epsilon_2+\epsilon_2^2))*LE_2 \qquad (2).$$

For example, when the linear error analysis model is applied to the pipelined ADC 114A, the coefficients $\{LE_{Ai}|i=1, 2, \ldots, \text{etc.}\}$ are equal to $\{LE_i|i=1, 2, \ldots, \text{etc.}\}$, respectively. In another example, when the linear error analysis model is applied to the pipelined ADC 114B, the coefficients $\{LE_{Bi}|i=1, 2, \ldots, \text{etc.}\}$ are equal to $\{LE_i|i=1, 2, \ldots, \text{etc.}\}$, respectively.

According to this embodiment, each ADC output contains the correct codes (e.g. $D_{correct}$) and the errors stemmed from wrong code weightings such as $(1+\epsilon_1)$ and $(1+\epsilon_2)$. By adjusting digital weighting taps such as the latest digital estimation values $\{G_{D,Ai}|i=1, 2, \ldots, \text{etc.}\}$ and the latest digital estimation values $\{G_{D,Bi}|i=1, 2, \ldots, \text{etc.}\}$, the digital module equalizes the linear errors of the gain values of the pipelined ADCs.

Please note that Equation (2) can be rewritten respectively for the pipelined ADCs 114A and 114B as follows:

$$D_{A,out}=D_{A,correct}-(\epsilon_{A1}-\epsilon_{A1}^2)*LE_{A1}-(\epsilon_{A2}-(\epsilon_{A1}*\epsilon_{A2}+\epsilon_{A2}^2))*LE_{A2}; \text{ and}$$

$$D_{B,out}=D_{B,correct}-(\epsilon_{B1}-\epsilon_{B1}^2)*LE_{B1}-(\epsilon_{B2}-(\epsilon_{B1}*\epsilon_{B2}+\epsilon_{B2}^2))*LE_{B2}.$$

In addition, the difference $\Delta X$ of this embodiment can be expressed as follows:

$$\Delta X = D_{B,out}-D_{A,out}=f(LE_{A1}, LE_{A2}, LE_{B1}, LE_{B2}, \epsilon_{A1}, \epsilon_{A2}, \epsilon_{B1}, \epsilon_{B2});$$

where f represents a function.

In general, the difference $\Delta X$ can be written as $f(LE_{A1}, LE_{A2}, \text{etc.}, LE_{B1}, LE_{B2}, \ldots, \text{etc.}, \epsilon_{A1}, \epsilon_{A2}, \ldots, \text{etc.}, \epsilon_{B1}, \epsilon_{B2}, \ldots, \text{etc.})$. Regarding the LMS adaptive processing mentioned above, the digital module can perform negative gradient estimation according to $\{LE_i|i=1, 2, \ldots, \text{etc.}\}$. More particularly, the iterations of the negative gradient estimation can be described according to the following equation:

$$\epsilon_i(\text{new})=\epsilon_i(\text{old})+\mu_i*\Delta X*g(LE_i, \epsilon_i(\text{old}));$$

where g represents the negative gradient estimation.

Figure 8:
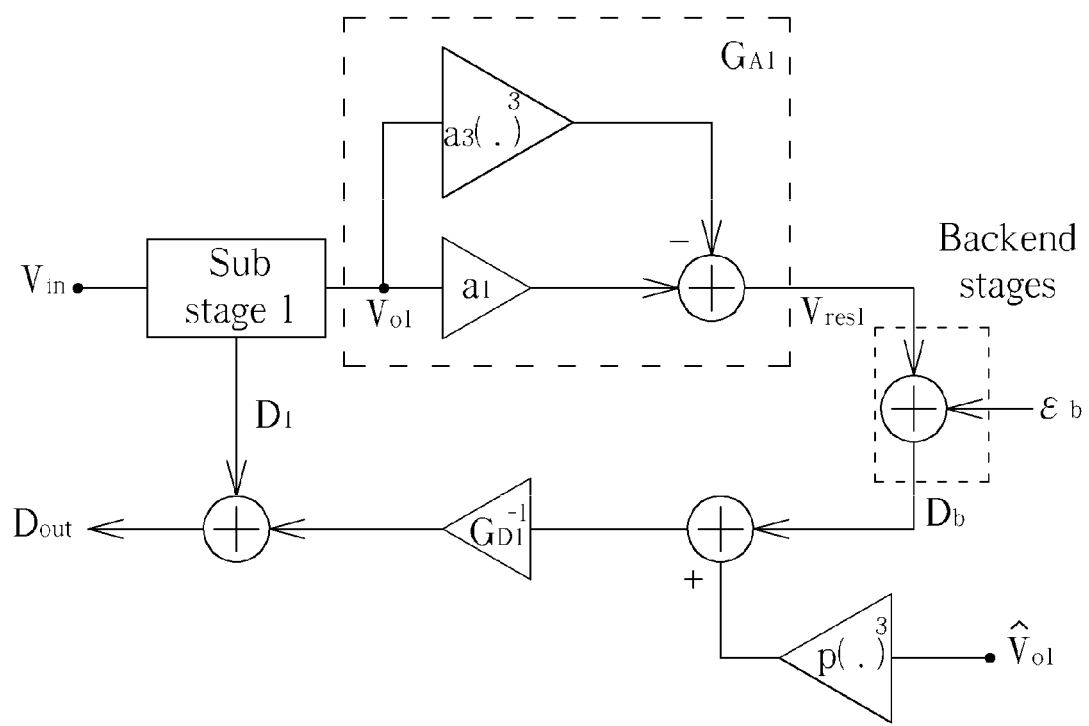
FIG. 8 illustrates an example of a nonlinear error analysis model utilized by the method shown in FIG. 2 according to an embodiment of the present invention.

FIG. 8 illustrates an example of a nonlinear error analysis model utilized by the method shown in FIG. 2 according to an embodiment of the present invention. This embodiment is a variation of the embodiment shown in FIG. 7, and some of the notations shown in FIG. 7 are also utilized in the nonlinear error analysis model shown in FIG. 8. According to this embodiment, only the sub-stage 1 (e.g. the 1$^{st}$ stage of the pipelined ADC 114A or the 1$^{st}$ stage of the pipelined ADC 114B) is involved, where the backend stages starts from the sub-stage next to the sub-stage 1.

Please note that $a_1$ and $a_3$ represent linear and nonlinear terms with respect to the output voltage $V_{o1}$ of the sub-stage 1, respectively. According to the nonlinear error analysis model, the following equations can be obtained:

$$V_{res1}=a_1*V_{o1}-a_3*V_{o1}^3; \text{ and}$$

$$V_{o1}=V_{in}-D_1.$$

For ideal backend analog-to-digital conversion, $$D_b \cong V_{res1}.$$

The correction can be expressed as follows:

$$D_{out}=D_1+G_D^{-1}*(D_b+p*(\hat{V}_{o1})^3) \quad (3).$$

In addition, for error-free digital outputs, the following conditions are required:
$\hat{V}_{o1} \cong V_{o1}$, where the arrowhead symbol "^" represents the estimate value of $V_{o1}$;

$$p=a_1*a_3; \text{ and}$$

$$G_D=a_1.$$

The nonlinear error analysis can be simplified by using a piecewise linear (PWL) module, which divides a curve into several sections and approximates the curve within each section by a linear line, in order to lower the computation complexity.

Figure 9:
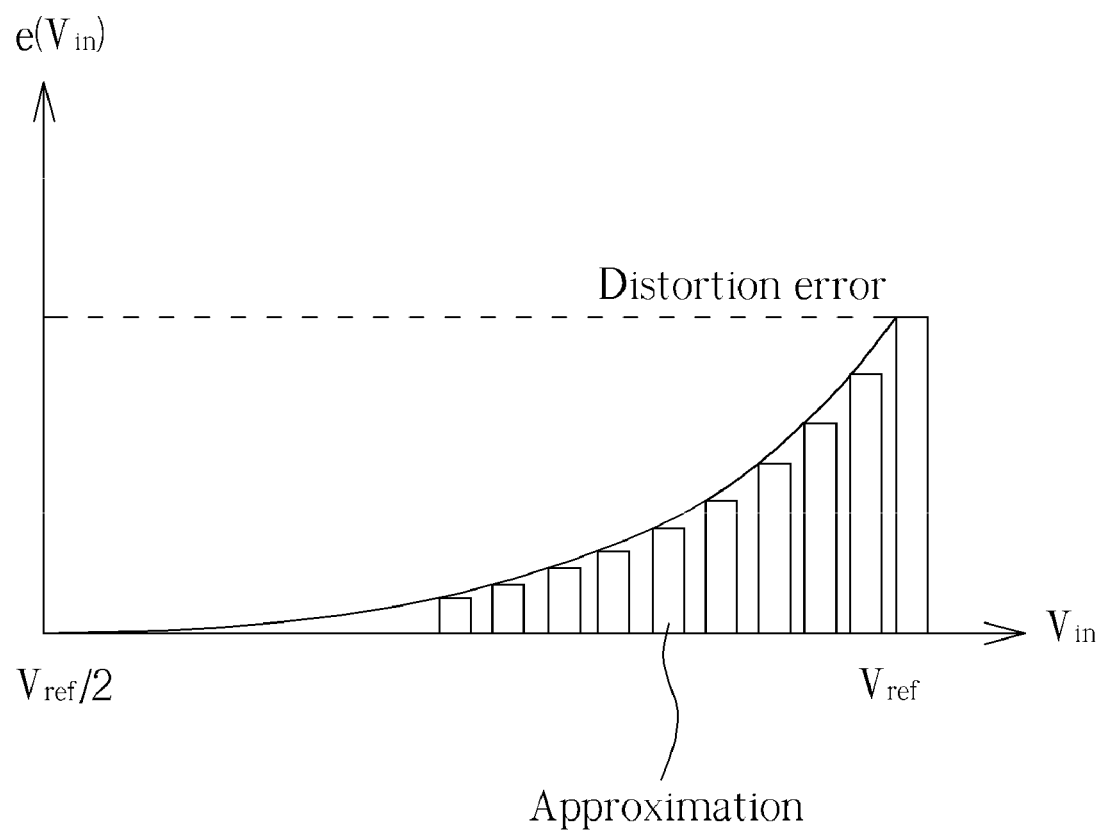
FIG. 9 illustrates an example of distortion errors according to one embodiment of the present invention.

FIG. 9 illustrates an example of the distortion errors approximation, where the vertical axis represents the distortion errors $e(V_{in})$ with respect to the input voltage $V_{in}$. Please note that the vertical bars under the curve shown in FIG. 9 are representatives of the aforementioned PWL approximation information in this embodiment. After performing linear approximation of the error curve as shown in FIG. 9, the digital module can perform the error correction accordingly.

Figure 10:
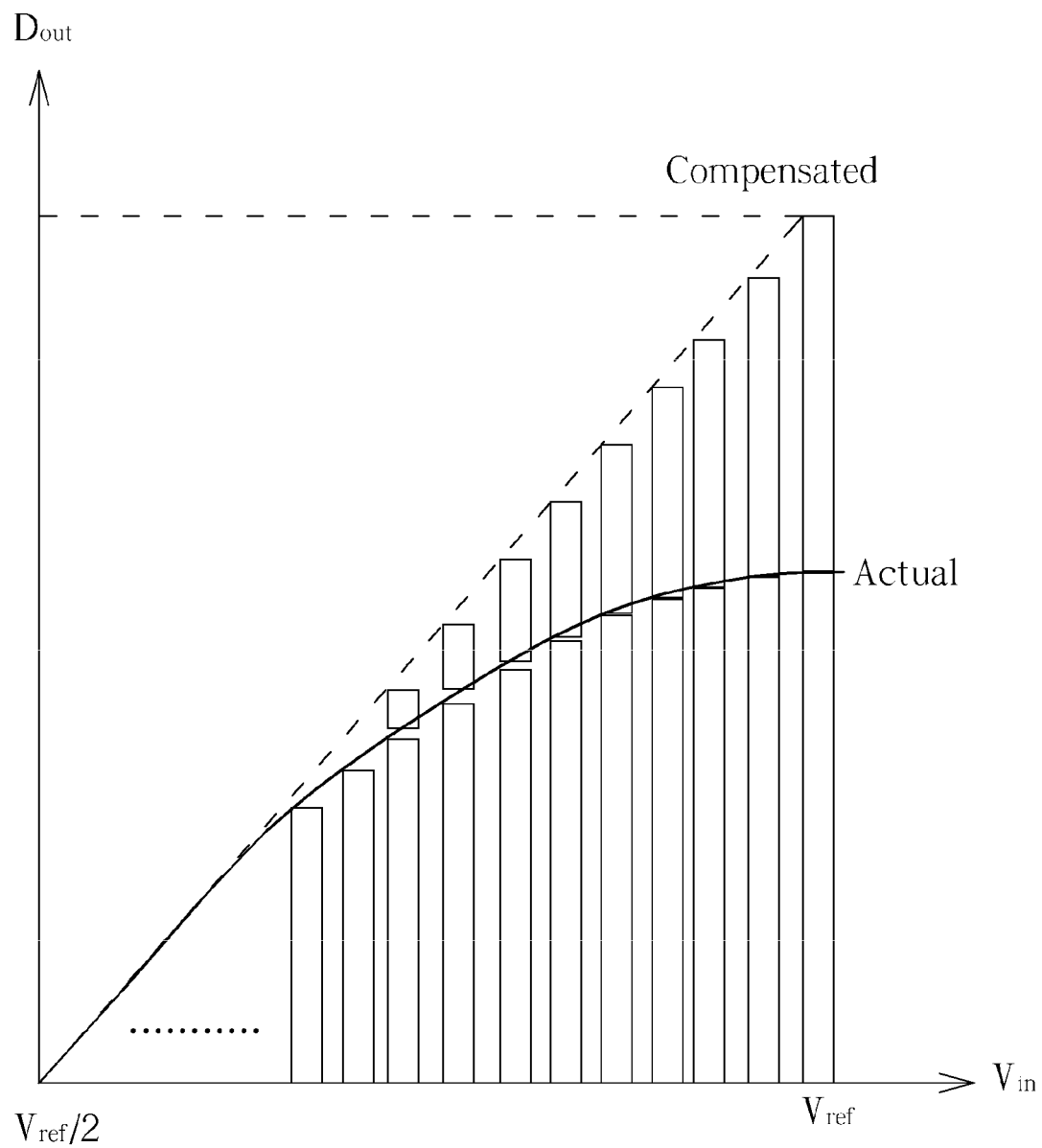
FIG. 10 illustrates examples of an associated actual curve and a compensated curve thereof in the embodiment.

FIG. 10 illustrates examples of an associated actual curve and a compensated curve thereof in the embodiment. Please note that the bars between the compensated curve and the actual curve reflect the vertical bars under the curve shown in FIG. 9, respectively. More details are described as follows.

The target function (i.e. the nonlinear error equation) can be expressed as follows:

$$G_{A1}(X)=y=a_1*x+a_3*x^3;$$

where $a_3<0$ in this embodiment.

Considering the case where x is greater than or equal to ¼, the digital module divides a domain of $G_{A1}(X)$ into three regions, such as Region 1, Region 2, and Region 3.

| | |
|---|---|
| $y=a_1*x$, where ¼≤x<½. | For Region 1: |
| $y=(a_1+a_3/16)*x$, where ½≤x<¾. | For Region 2: |
| $y=(a_1+a_3/2)*x-(a_3/8)$, where ¾≤x<1. | For Region 3: |

Due to the odd symmetry nature of the target function $G_{A1}(X)$, the value of x that falls within the interval $[-1, -¼]$ can be well applied to the above equations with a unary minus modification. In this embodiment, when the value of x falls between $-¼$ and $¼$, it is considered error-free since the corresponding amount of nonlinear error is insignificant.

According to this embodiment, there exists discontinuity between Region 2 and Region 3 for the sake of easier hardware implementation. In practice, a discontinuity value $E_{dis}$ is utilized for covering the discontinuity mentioned above, where the discontinuity value $E_{dis}$ can be expressed as follows:

$$E_{dis}=(a_3/64).$$

As the values of x should be estimated during the error correction, the inverse function of $G_{A1}(X)$ is required, and can be expressed as follows:

| | |
|---|---|
| $x=y/a_1$ | for Region 1; |
| $x=y/(a_1+a_3/16)$ | for Region 2; and |
| $x=(y+a_3/8)/(a_1+a_3/2)$ | for Region 3. |

Figure 11:
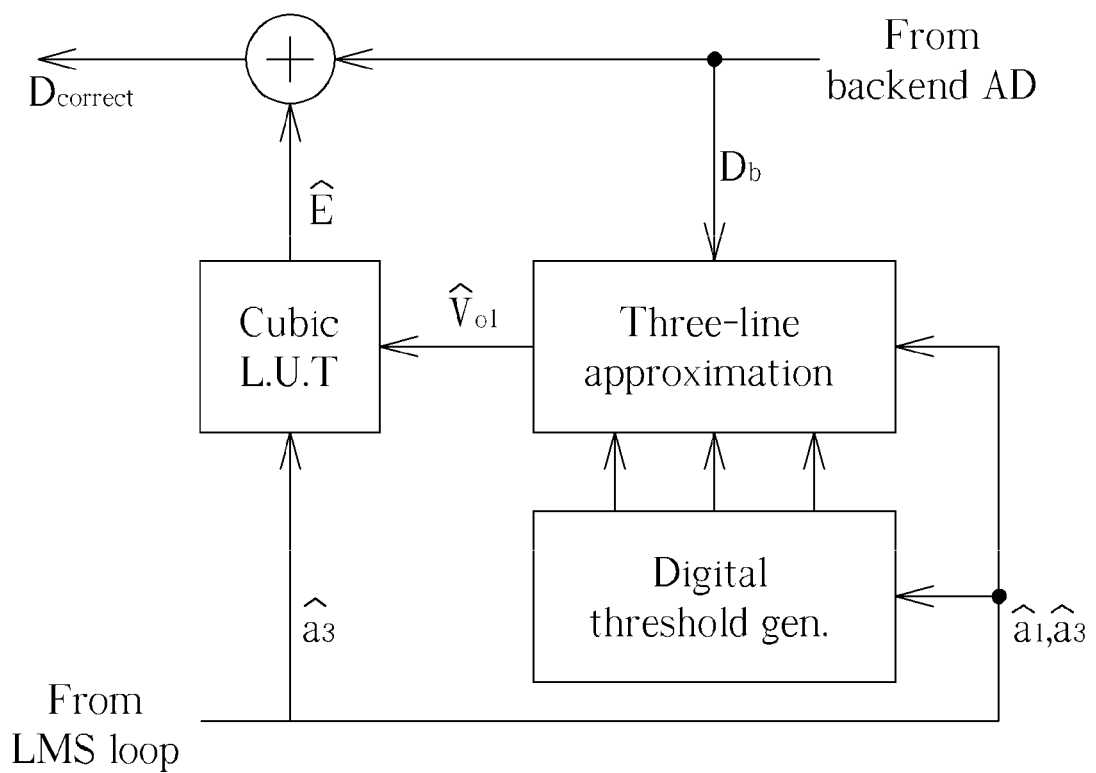
FIG. 11 illustrates examples of specific implementation details of the piecewise linear compensation scheme according to an embodiment of the present invention.

FIG. 11 illustrates examples of specific implementation details of the piecewise linear compensation scheme according to an embodiment of the present invention. The architecture can be utilized for performing the nonlinear error correction according to the nonlinear error analysis model shown in FIG. 8.

According to this embodiment, a plurality of estimated values $\hat{a}_1$ and $\hat{a}_3$ respectively corresponding to $a_1$ and $a_3$ are generated from an LMS loop of the digital module (e.g. the first digital calculation path or the second digital calculation path mentioned above). The estimated values $\hat{a}_1$ and $\hat{a}_3$ are inputted into a digital threshold generator ("Digital threshold gen.") and a three-line approximation unit ("Three-line approximation"), while the estimated value $\hat{a}_3$ is further inputted into a cubic look up table ("Cubic L.U.T"). As shown in FIG. 11, the backend digital value $D_b$ derived from backend analog-to-digital conversion ("From backend AD") is inputted into the three-line approximation unit.

More particularly, in this embodiment, the digital threshold generator generates a plurality of digital thresholds, and provides the three-line approximation unit with the digital thresholds, where the digital thresholds are utilized for dividing the domain of $G_{A1}(X)$ into the three regions, such as Region 1, Region 2, and Region 3. In addition, the three-line approximation unit performs the piecewise linear compensation scheme according to the backend digital value $D_b$ and the digital thresholds from the digital threshold generator, in order to generate the estimated value $\hat{V}_{o1}$ corresponding to the output voltage $V_{o1}$. Then, the cubic look up table performs a look-up operation according to the estimated value $\hat{V}_{o1}$ and the estimated value $\hat{a}_3$ to generate an estimated error $\hat{E}$. As a result, an adder sums up the estimated error $\hat{E}$ and the backend digital value $D_b$ to generate $D_{correct}$, which represents a correct code in this embodiment.

Regarding the nonlinear error correction, Equation (3) can be written as follows:

$$D_{out} = D_1 + G_D^{-1} * (D_b + p * (\hat{V}_{o1})^3)$$
$$= D_1 + (1/(a_1 * (1 + \epsilon_{a1}))) * (D_b + a_3 * (1 + \epsilon_{a3}) * (\hat{V}_{o1})^3)$$
$$= D_{correct} - (D_b/a_1) * \epsilon_{a1} - (a_3/a_1) * (\hat{V}_{o1})^3 * \epsilon_{a3}$$
$$= D_{correct} - LE_{a1} * \epsilon_{a1} - NE_a * \epsilon_{a3};$$

where:

$$LE_{a1} = (D_b/a_1); \text{ and}$$

$$NE_a = (a_3/a_1) * (\hat{V}_{o1})^3.$$

Similarly, the difference $\Delta X$ of this embodiment can be expressed as follows:

$$\Delta X = D_{B, out} - D_{A, out} = f_n(LE_{A1}, NE_A, LE_{B1}, NE_B, \epsilon_{a1}, \epsilon_{a3}, \epsilon_{b1}, \epsilon_{b3});$$

where $f_n$ represents a function.

In addition, the associated iterations can be described according to the following equation:

$$\epsilon_{a,b\ 3}(new) = \epsilon_{a,b\ 3}(old) + \mu * \Delta X * g_n(NE_A, NE_B, \epsilon_{a,b\ 3}(old)).$$

where $g_n$ represents the negative gradient estimation.

In contrast to the related art, the present invention method and apparatus can achieve high speed during analog-to-digital conversion without degrading accuracy.

It is another advantage of the claimed invention that the present invention method and apparatus can be implemented in a cost-efficient manner.

Those skilled in the art will readily observe that numerous modifications and alterations of the device and method may be made while retaining the teachings of the invention.

What is claimed is:

1. A method for analog-to-digital conversion, comprising:
   providing the plurality of pipelined analog-to-digital converters (ADCs), wherein respective inputs of the pipelined ADCs are electrically connected to a same analog signal;
   utilizing the pipelined ADCs to perform analog-to-digital conversion on the analog signal;
   receiving digital outputs generated by the pipelined ADCs performing analog-to-digital conversion on the analog signal; and
   performing digital calculations on the digital outputs to generate a calibrated digital output, comprising:
      providing a plurality of digital calculation paths respectively corresponding to the pipelined ADCs;
      for each digital calculation path corresponding to an associate pipelined ADC of the pipelined ADCs, performing an adaptive processing according to a difference between latest values of respective outputs of the digital calculation paths, in order to generate at least latest digital estimation values of gain values of a plurality of stages of the associate pipelined ADC;
      for each digital calculation path corresponding to the associate pipelined ADC of the pipelined ADCs, performing a digital code combination on at least the latest digital estimation values of the gain values and respective digital codes of an associated digital output corresponding to the associate pipelined ADC, in order to perform calibration on the digital calculation path, wherein the digital codes correspond to the stages of the associate pipelined ADC, respectively; and
      averaging latest values of the respective outputs of the digital calculation paths to generate the calibrated digital output.

2. The method of claim 1, wherein the step of performing the digital calculations on the digital outputs to generate the calibrated digital output further comprises:
   for each digital calculation path corresponding to the associate pipelined ADC of the pipelined ADCs, performing the adaptive processing according to the difference between the latest values of the respective outputs of the digital calculation paths, in order to generate a latest digital estimation value of a nonlinear parameter of the associate pipelined ADC;
   for each digital calculation path corresponding to the associate pipelined ADC of the pipelined ADCs, performing the digital code combination on the latest digital estimation values of the gain values, the latest digital estimation value of the nonlinear parameter, and the respective digital codes of the associated digital output corresponding to the associate pipelined ADC, in order to perform calibration on the digital calculation path.

3. The method of claim 1, wherein the step of performing the digital calculations on the digital outputs to generate the calibrated digital output further comprises:
   for each digital calculation path corresponding to the associate pipelined ADC of the pipelined ADCs, estimating coefficients corresponding to errors of the associate pipelined ADC according to the digital codes respectively corresponding to the stages; and
   for each digital calculation path corresponding to the associate pipelined ADC of the pipelined ADCs, utilizing the estimated coefficients to perform the adaptive processing.

4. The method of claim 1, wherein the pipelined ADCs are operated in different residue modes.

5. The method of claim 1, wherein the pipelined ADCs are operated in different residue modes.

6. An apparatus for analog-to-digital conversion, comprising:
   a digital module arranged to receive digital outputs generated by a plurality of pipelined analog-to-digital converters (ADCs) performing analog-to-digital conversion on a same analog signal, wherein the digital module comprises:
      a plurality of digital calculation paths respectively corresponding to the pipelined ADCs, wherein each digital calculation path corresponding to an associate pipelined ADC of the pipelined ADCs is electrically connected to the associate pipelined ADC;
wherein the digital module performs digital calculations on the digital outputs to generate a calibrated digital output.

7. The apparatus of claim 6, wherein the apparatus comprises the plurality of pipelined ADCs; and respective inputs of the pipelined ADCs are electrically connected to the analog signal, and the apparatus utilizes the pipelined ADCs to perform analog-to-digital conversion on the analog signal.

8. The apparatus of claim 7, wherein each digital calculation path corresponding to the associate pipelined ADC of the pipelined ADCs comprises:
an adaptive processing unit arranged to perform an adaptive processing according to a difference between latest values of respective outputs of the digital calculation paths, in order to generate at least latest digital estimation values of gain values of a plurality of stages of the associate pipelined ADC; and
a digital code combination unit arranged to perform a digital code combination on at least the latest digital estimation values of the gain values and respective digital codes of an associated digital output corresponding to the associate pipelined ADC, in order to perform calibration on the digital calculation path, wherein the digital codes correspond to the stages of the associate pipelined ADC, respectively;
wherein the digital module further comprises:
an average unit arranged to average latest values of the respective outputs of the digital calculation paths to generate the calibrated digital output.

9. The apparatus of claim 8, wherein the adaptive processing unit performs the adaptive processing according to the difference between the latest values of the respective outputs of the digital calculation paths, in order to generate a latest digital estimation value of a nonlinear parameter of the associate pipelined ADC; and the digital code combination unit performs the digital code combination on the latest digital estimation values of the gain values, the latest digital estimation value of the nonlinear parameter, and the respective digital codes of the associated digital output corresponding to the associate pipelined ADC, in order to perform calibration on the digital calculation path.

10. The apparatus of claim 8, wherein each digital calculation path corresponding to the associate pipelined ADC of the pipelined ADCs comprises:
an estimation unit arranged to estimate coefficients corresponding to errors of the associate pipelined ADC according to the digital codes respectively corresponding to the stages;
wherein the adaptive processing unit of the digital calculation path corresponding to the associate pipelined ADC utilizes the estimated coefficients to perform the adaptive processing.

11. The apparatus of claim 7, wherein the pipelined ADCs are operated in different residue modes.

12. The apparatus of claim 6, wherein each digital calculation path corresponding to the associate pipelined ADC of the pipelined ADCs comprises:
a Least Mean Square (LMS) adaptive processing unit arranged to perform LMS adaptive processing according to a difference between latest values of respective outputs of the digital calculation paths, in order to generate at least latest digital estimation values of gain values of a plurality of stages of the associate pipelined ADC; and
a digital code combination unit arranged to perform a digital code combination on at least the latest digital estimation values of the gain values and respective digital codes of an associated digital output corresponding to the associate pipelined ADC, in order to perform calibration on the digital calculation path, wherein the digital codes correspond to the stages of the associate pipelined ADC, respectively;
wherein the digital module further comprises:
an average unit arranged to average latest values of the respective outputs of the digital calculation paths to generate the calibrated digital output.

13. The apparatus of claim 12, wherein the LMS adaptive processing unit performs the LMS adaptive processing according to the difference between the latest values of the respective outputs of the digital calculation paths, in order to generate a latest digital estimation value of a nonlinear parameter of the associate pipelined ADC; and the digital code combination unit performs the digital code combination on the latest digital estimation values of the gain values, the latest digital estimation value of the nonlinear parameter, and the respective digital codes of the associated digital output corresponding to the associate pipelined ADC, in order to perform calibration on the digital calculation path.

14. The apparatus of claim 12, wherein each digital calculation path corresponding to the associate pipelined ADC of the pipelined ADCs comprises:
an estimation unit arranged to estimate coefficients corresponding to errors of the associate pipelined ADC according to the digital codes respectively corresponding to the stages;
wherein the LMS adaptive processing unit of the digital calculation path corresponding to the associate pipelined ADC utilizes the estimated coefficients to perform the LMS adaptive processing.

15. The apparatus of claim 6, wherein the pipelined ADCs are operated in different residue modes.

16. A method for analog-to-digital conversion, comprising:
receiving digital outputs generated by a plurality of pipelined analog-to-digital converters (ADCs) performing analog-to-digital conversion on a same analog signal; and
performing digital calculations on the digital outputs to generate a calibrated digital output, comprising:
providing a plurality of digital calculation paths respectively corresponding to the pipelined ADCs;
for each digital calculation path corresponding to an associate pipelined ADC of the pipelined ADCs, performing Least Mean Square (LMS) adaptive processing according to a difference between latest values of respective outputs of the digital calculation paths, in order to generate at least latest digital estimation values of gain values of a plurality of stages of the associate pipelined ADC, respectively;
for each digital calculation path corresponding to the associate pipelined ADC of the pipelined ADCs, performing a digital code combination on at least the latest digital estimation values of the gain values and respective digital codes of an associated digital output corresponding to the associate pipelined ADC, in order to perform calibration on the digital calculation path, wherein the digital codes correspond to the stages of the associate pipelined ADC, respectively; and
averaging latest values of the respective outputs of the digital calculation paths to generate the calibrated digital output.

17. The method of claim 16, wherein the step of performing the digital calculations on the digital outputs to generate the calibrated digital output further comprises:

for each digital calculation path corresponding to the associate pipelined ADC of the pipelined ADCs, performing the LMS adaptive processing according to the difference between the latest values of the respective outputs of the digital calculation paths, in order to generate a latest digital estimation values of a nonlinear parameter of the associate pipelined ADC;

for each digital calculation path corresponding to the associate pipelined ADC of the pipelined ADCs, performing the digital code combination on the latest digital estimation values of the gain values, the latest digital estimation value of the nonlinear parameter, and the respective digital codes of the associated digital output corresponding to the associate pipelined ADC, in order to perform calibration on the digital calculation path.

18. The method of claim 16, wherein the step of performing the digital calculations on the digital outputs to generate the calibrated digital output further comprises:

for each digital calculation path corresponding to the associate pipelined ADC of the pipelined ADCs, estimating coefficients corresponding to errors of the associate pipelined ADC according to the digital codes respectively corresponding to the stages; and for each digital calculation path corresponding to the associate pipelined ADC of the pipelined ADCs, utilizing the estimated coefficients to perform the LMS adaptive processing.

* * * * *